United States Patent
Schorpp

(10) Patent No.: US 7,567,372 B2
(45) Date of Patent: Jul. 28, 2009

(54) ELECTRICAL DEVICE UTILIZING CHARGE RECYCLING WITHIN A CELL

(75) Inventor: Marcus Schorpp, Lempäälä (FI)

(73) Assignee: Nokia Corporation, Espoo (FI)

( * ) Notice: Subject to any disclaimer, the term of this patent is extended or adjusted under 35 U.S.C. 154(b) by 106 days.

(21) Appl. No.: 10/568,310

(22) PCT Filed: Aug. 29, 2003

(86) PCT No.: PCT/FI03/00634

§ 371 (c)(1),
(2), (4) Date: Feb. 14, 2006

(87) PCT Pub. No.: WO2005/022246

PCT Pub. Date: Mar. 10, 2005

(65) Prior Publication Data

US 2006/0261377 A1    Nov. 23, 2006

(51) Int. Cl.
*G02B 26/00* (2006.01)

(52) U.S. Cl. ...................................... 359/290

(58) Field of Classification Search .......... 257/213, 257/215, 244; 359/237, 238, 290–298
See application file for complete search history.

(56) References Cited

U.S. PATENT DOCUMENTS

| | | | |
|---|---|---|---|
| 4,291,337 A | 9/1981 | Takamura et al. | |
| 4,401,984 A | 8/1983 | Tabata et al. | |
| 6,222,596 B1* | 4/2001 | Veerasamy | 349/50 |
| 2004/0120180 A1* | 6/2004 | Rotenberg et al. | 365/151 |
| 2004/0146764 A1* | 7/2004 | Tsai et al. | 429/27 |
| 2007/0201124 A1* | 8/2007 | Whitesides et al. | 359/296 |

FOREIGN PATENT DOCUMENTS

| | | |
|---|---|---|
| WO | WO 2001/48531 | 7/2001 |
| WO | WO 2003/107087 | 12/2003 |
| WO | WO 2004/001715 | 12/2003 |

\* cited by examiner

*Primary Examiner*—Ricky L Mack
*Assistant Examiner*—Mahidere S Sahle
(74) *Attorney, Agent, or Firm*—Alfred A. Fressola; Ware, Fressola, Van Der Sluys & Aldophson LLP

(57) ABSTRACT

The invention relates to an electrically controlled device, which device comprises at least one electrically and individually controllable cell (L,R) with at least two separate electrode structures (10,50) arranged within the cell, each of the electrode structures capable of storing electric charges (C10, C50). The device further comprises a charge transfer mechanism (P,S10,S20,TFT10,TFT50) to transfer electric charges in a temporally controlled manner between the at least two separate electrode structures (10,50), and that for at least one of the electrode structures within the cell, the charge transfer mechanism comprises substantially the only means for providing electrical power and/or electrical driving. The invention reduces the power consumption of the electrode structures by use of a new type of in-cell type charge recycling. The invention is especially suitable to be used in light modulator components based on the use of electrically deformable viscoelastic materials.

14 Claims, 5 Drawing Sheets

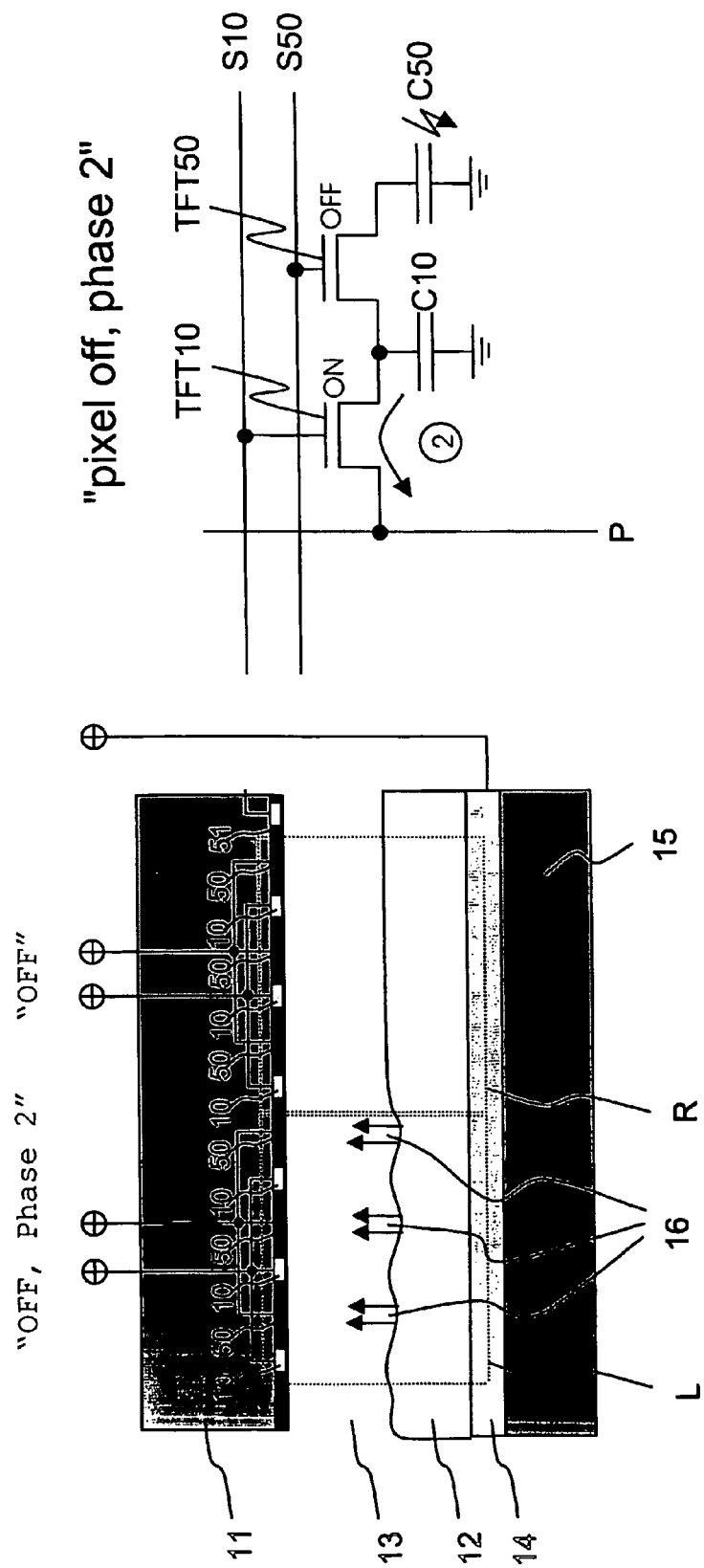

ELECTRICAL DEVICE UTILIZING CHARGE RECYCLING WITHIN A CELL

CROSS REFERENCE TO RELATED APPLICATION

This application is for entry into the U.S. national phase under § 371 for International Application No. PCT/FI03/000634 having an international filing date of Aug. 29, 2003, and from which priority is claimed under all applicable sections of Title 35 of the United States Code including, but not limited to, Sections 120, 363 and 365(c).

TECHNICAL FIELD

The present invention relates to an electrically controlled cell type device comprising at least one electrically and individually controllable cell with at least two separate electrode structures arranged within the cell, the electrode structures capable of storing electric charges.

BACKGROUND OF THE INVENTION

Display panels in the form of array of cells, where individual cells contain electrically deformable material, are known in the art. Patent publication WO 01/48531, for example, discloses display panel structures where the cells each comprise two deformable dielectric layers, which meet at a common interface. One of said dielectrics can be air, the other is preferably a polymer material acting as a relief forming gel. For each cell, there is a first electrode structure, a support electrode structure is arranged on one side (below) of said dielectric layers, and a second electrode structure, a signal electrode structure on the other side (above) of said layers, there being means for providing signals to the signal electrodes in order to create electric fields through the two dielectric layers and to further create surface reliefs on the gel surface at the interface of said two dielectrics. The periodical, typically sinusoidally varying reliefs created on the gel surface in each of the cells allows under the effect of light from a light source to create images on the display panel, which are viewable by the naked eye.

The major shortcomings of such light modulators may be associated with the practical difficulties in producing desired gel relief profiles with good precision. This, of course, impairs the light modulating capabilities of the individual pixels or cells. Especially in the case of portable devices, the power consumption also becomes very important. The increase of diffraction amplitude of the gel relief typically also increases the power consumption.

With the goal of bringing display quality closer to that of a paper print, for example, the brightness and contrast of the displays must be further improved. In order to allow the use of display devices in small-size portable devices, the power consumption and thickness of the display devices should also be further reduced. To make mass production of portable devices possible, the manufacturing technology of the display devices should be simple in order to allow lower prices. The displays should also have short response times to be able to display video or similar fast changing image content without degration of the image quality. The aforementioned requirements also apply on other light modulator devices than display panels. Other applications which may be based on the use of electrically controlled deformation of dielectric and viscoelastic transparent materials include, but are not limited to, electrically controlled diffractive or refractive lenses, or electrically reconfigurable optical waveguide couplers.

In an earlier patent application PCT/FI02/00512 (now published under WO 2003/107087), the Applicant has already proposed a novel electrode configuration for light modulator cells based on the use of dielectric and viscoelastic materials to facilitate enhanced and active deformation of the viscoelastic material. The basic idea of said electrode configuration is to utilize active fieldshaping enhancement electrode structure located in the proximity, and in addition, to the traditional signal electrode structure of a cell in order to affect the electric field between the signal electrode structure and the support electrode structure and through the viscoelastic layer in a manner that the deformation amplitude of the viscoelastic layer in the cell is increased. The enhancement electrodes may have with respect to the signal electrodes, for example, an in-plane-type configuration or a sandwich-type configuration. The various embodiments of the enhancement electrode configurations are explained in more detail in the aforementioned earlier application.

The enhancement electrodes according to PCT/FI02/00512 can, among other things, increase the diffraction efficiency of the light modulator cells, shorten the response time required to switch a cell (pixel) between on and off states, and reduce the voltage levels required for a defined diffraction amplitude, that is for a certain height of a gel relief. Therefore, the developments described in said patent application aim to the manufacturing of light modulators with better optical contrast, higher switching speed and smaller power consumption.

SUMMARY OF THE INVENTION

However, the Applicant has noticed, that the enhancement electrode performance and properties especially regarding the power consumption may be further significantly improved. Thus, the main purpose of the present invention is to provide a novel and simple scheme for powering the enhancement electrodes, thus making the use of enhancement electrodes possible without significantly increasing the power consumption of the device. Together with the teachings given in PCT/FI02/00512, the enhancement electrode driving system according to the current invention helps to manufacture light modulators that have good optical properties combined with low power consumption. Such optical modulators find many applications and can be used, for example, in display panels for portable devices.

The basic idea regarding the use of the enhancement electrodes is that according to the invention the enhancement electrode structure is powered by arranging a charge transfer from the signal electrode structure so that no separate or additional power supply, and no additional column lines are required to drive the enhancement electrodes in an active matrix system. The invention can be in this sense understood as a special kind of charge recycling within a single cell of an electric device, where the electric charges stored in the signal electrodes of said cell are further transferred to the enhancement electrodes of the same cell in a suitable temporal manner.

In its broadest sense, however, the current invention is not limited to the new type of driving scheme for the enhancement electrodes, but other electrical implementations for the basic idea of charge recycling on a cell or pixel basis in an electrical device can be thought of. Instead of enhancement electrodes, a cell or pixel in a light modulator or even other electrical device might be arranged with a charge recycling/storing capacitor or similar element, which is individually addressable via one or more switching elements. In the literature charge recycling schemes have been researched to lower the power consumption of capacitor-based display systems, however, in all reported systems so far the capacitors used for charge storage and recycling have been arranged outside the pixel display structure and therefore outside individual cells. These charge recycling storages/capacitors have also been common to all of the pixels, i.e. not individually addressable on single pixel basis. The current presentation is, according to the best knowledge of the Applicant, the first to disclose the idea of arranging individually addressable charge storages within individual pixels of a cell type device.

To attain these purposes, the electrically controlled device according to the invention is primarily characterized in that the device comprises at least one electrically and individually controllable cell with at least two separate electrode structures arranged within said cell, said electrode structures capable of storing electric charges, the device comprising further means to transfer electric charges in a temporally controlled manner between said at least two separate electrode structures, and that for at least one of said the electrode structures within said cell, said charge transfer means comprises substantially the only means for providing electrical power and/or electrical driving.

The preferred embodiments of the invention, and especially those related to enhancement electrode improved optical modulators, will become more apparent to a person skilled in the art through the description and examples given herein below, and also through the appended claims.

BRIEF DESCRIPTION OF THE DRAWINGS

In the following, the invention will be described in more detail with reference to the appended drawings, in which FIG. 6 illustrates schematically the behaviour of the gel layer in a pixel during the optional phase 2 of the switching off sequence, FIG. 7 illustrates schematically the phase 2 of the switching off sequence in terms of the capacitance of the signal and enhancement electrodes.

DETAILED DESCRIPTION OF THE INVENTION

In the following, the invention is explained in more detail using as an example an enhancement electrode driving system in an optical cell type display. The most important benefits of the invention compared to the prior art solutions are pointed out.

Earlier patent application PCT/FI02/00512 describes the basic function and the layout of the enhancement electrodes in detail, but does not teach any implementation scheme for driving the enhancement electrodes except the obvious solution using a separate power supply and control. In the following, the main attention is directed to the electrical functioning of the electrode configuration. If necessary, more detailed information regarding to the possible layouts of enhancement, signal, and support electrodes in an optical display device may also be found from the aforementioned earlier application.

To begin, it has to be pointed out that the signal- and enhancement electrode systems can be regarded as separated capacitors. From the electrical point of view, an active matrix display system can be therefore seen as a matrix of capacitors, in which each capacitor can be switched separately.

Figure 1:
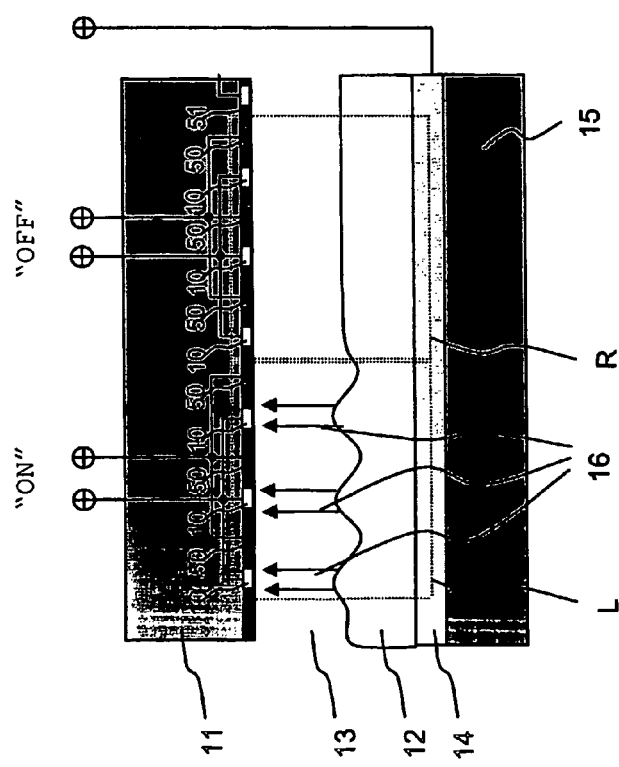
FIG. 1 illustrates schematically two adjacent pixels of an enhancement electrode improved display based on the use of electrically deformable dielectric viscoelastic gel.

FIG. 1 shows schematically the geometrical setup of two adjacent pixels in an enhancement electrode improved display system, where the left pixel L is switched on, and the right pixel R is switched off. Each pixel L,R comprises several strip like signal electrodes 10 arranged parallel respect to each other on a substrate 11, which may be for example glass. According to PCT/FI02/00512, the strip like enhancement electrodes 50 are arranged in between and in-plane with said signal electrodes 10. A dielectric and viscoelastic gel material 12, for example polymer, is applied onto a support electrode 14 and facing the signal 10 and enhancement electrodes 50. A gap 13, for example an air gap, is left between the surface of the viscoelastic layer 12 and the signal 10 and enhancement electrodes 50. The usually transparent support electrode 14 providing AC or DC potential is preferably made of indium tin oxide (ITO), as is known in the art, on the surface of a transparent front plate 15. The front plate 15 may be for example glass.

The light may enter the structure depicted in FIG. 1 either through the front plate 15 or through the substrate 11. The device can be designed to operate either in transmissive or reflective mode depending on the light transmitting or reflecting properties of the various elements of the device.

As can be seen from FIG. 1, the signal electrodes 10 and the enhancement electrodes 50 have substantially similar geometrical parameters and, therefore, also their capacitance determined against the opposite support electrode 14 is substantially equal. Even if this situation is desirable, the invention is not limited only to such applications, where the capacitance values of the different electrodes is closely matched.

Figure 2:
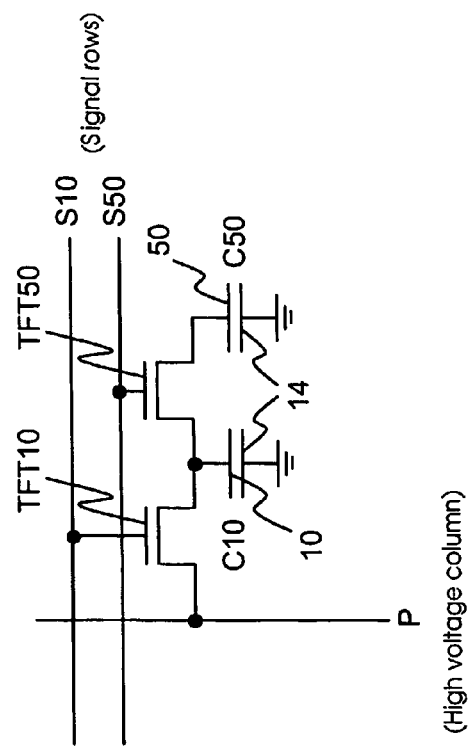
FIG. 2 illustrates schematically signal and enhancement electrodes of a pixel in terms of the electrical capacitance of said electrodes.

FIG. 2 describes now schematically the signal 10 and enhancement 50 electrodes of a pixel in terms of electrical capacitance together with the novel charge transfer principle according to the current invention.

An active pixel in most display systems can be principally in the electrical sense described as a capacitor. In FIG. 2 and in the following figures the capacitance of the signal electrodes 10 is denoted with C10, and the capacitance of the enhancement electrodes 50 is denoted with C50. The "counter electrode" for both of the signal 10 and enhancement 50 electrodes is the support electrode 14, which is implemented here as a planar uniform electrode covering the total area of both the signal 10 and enhancement 50 electrodes. For the sake of simplicity, FIGS. 2, 3, 5, 7, and 8 show the support electrode 14 connected to the ground potential. However, it is also possible that the support electrode 14 might be connected to a different potential in order to optimize the performance of the device. For example, the support electrode 14 might be connected to a constant AC or DC voltage, or its voltage may be actively temporally controlled depending on the exact application.

Prior art active matrix displays use typically only one TFT transistor (TFT, Thin Film Transistor) per pixel, and therefore they need only one signal row S10 to control the function of said transistors. Those transistors along a single column are powered via a high voltage column P. In some commercial displays multiple (double) transistors per pixel are used to control the signal electrodes 10, and then double high voltage columns and signal rows are needed to supply and control the extra transistor(s). This indicates that the implementation of one additional transistor per pixel and one additional column per matrix column is not a severe technical problem.

According to the current invention the enhancement electrode system 50 of a pixel is not directly connected to any outside power supply, but it utilizes in a novel way the charge transferred from the signal electrode 10. In the following the temporal phases of this charge transfer operation are described in more detail referring to FIGS. 3-8.

Figure 3:
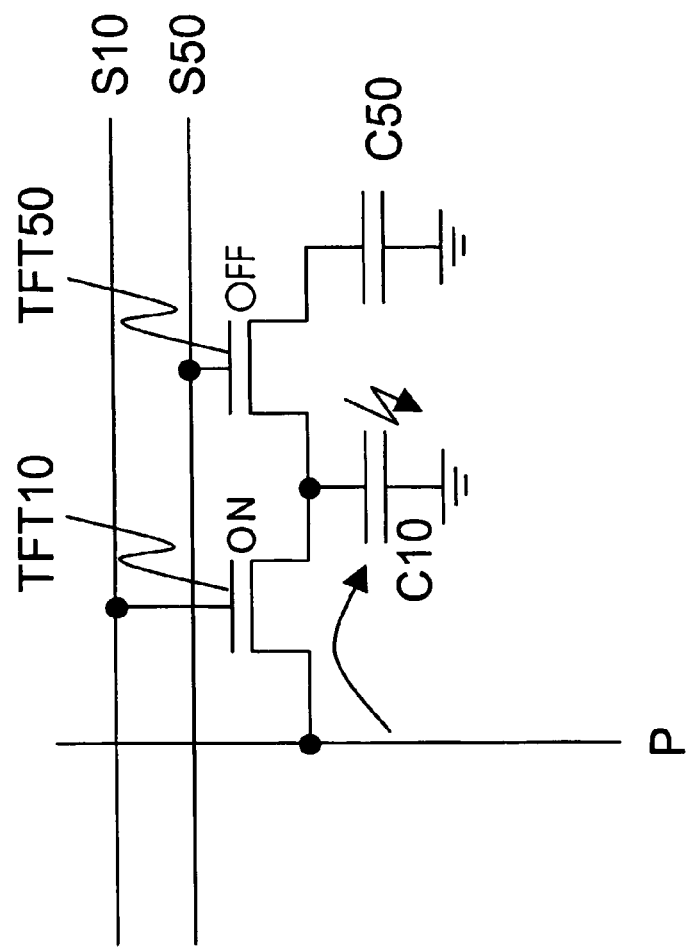
FIG. 3 illustrates schematically the action of switching on a pixel in terms of the capacitance of the signal and enhancement electrodes.

FIG. 3 describes schematically the action of switching a pixel on. This phase resembles closely to the operation of a system without enhancement electrodes 50. Starting from a point where both the signal C10 and enhancement C50 capacitors are discharged (pixel is in off state), the signal electrode TFT10 is switched on, the signal electrode capacitor C10 is charged and the pixel therefore becomes activated. In FIG. 3 it is indicated through the flash sign beside the signal electrode capacitor C10 that said capacitor is charged, i.e. under high voltage. The enhancement electrodes 50 are on the same electric potential as the support electrodes 14, advantageously influencing the shape of the electric field in the cell.

Figure 5:
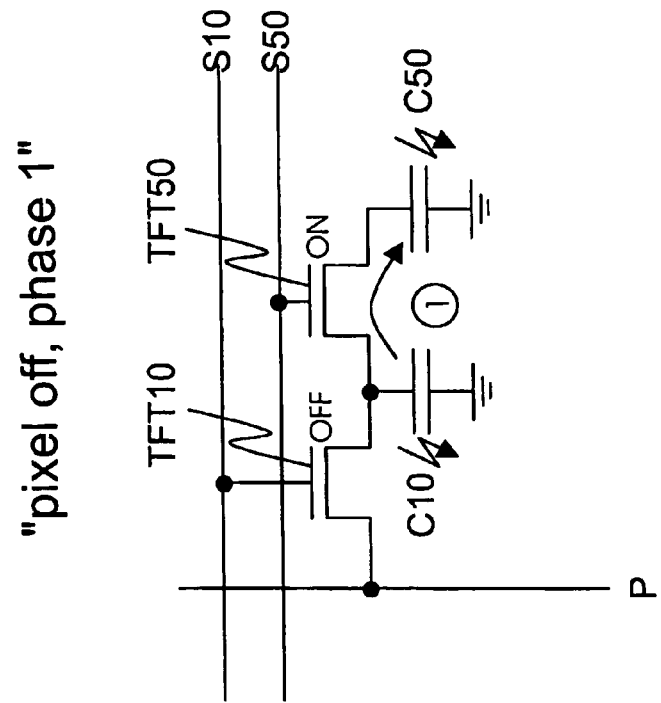
FIG. 5 illustrates schematically the phase 1 of the switching off sequence in terms of the capacitance of the signal and enhancement electrodes.
Figure 4:
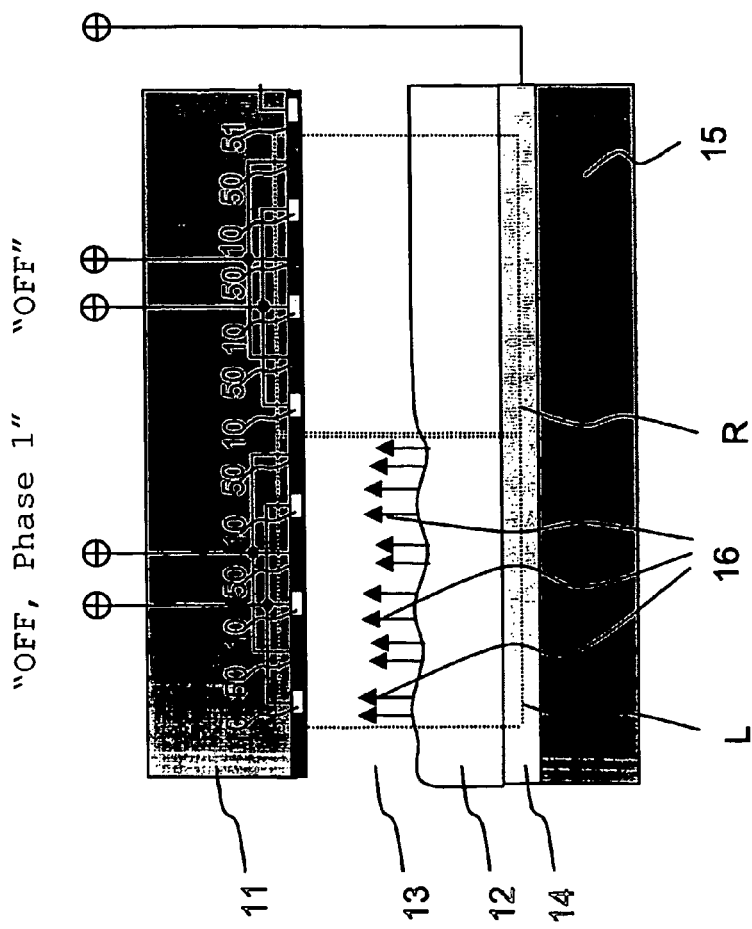
FIG. 4 illustrates schematically the behaviour of the gel layer in a pixel during the phase 1 of the switching off sequence.

FIGS. 4 and 5 describe now phase 1, which starts the switching off sequence of the pixel L. During this phase 1 the signal electrode capacitor C10 becomes discharged. In a prior art system, the signal electrode capacitor C10 would be discharged by driving the high voltage column P to the ground potential and opening the signal electrode transistor TFT10, whereupon the energy of said capacitor is lost to the ground. According to the current invention, the charge of the signal electrode capacitor C10 is transferred and exploited by the enhancement electrode capacitor C50 through not opening the signal electrode transistor TFT10, but the enhancement electrode transistor TFT50. This drives both capacitors C10, C50 to the same voltage, which is substantially half of the signal voltage level originally applied to the signal electrodes 10. Due to the reduced signal voltage, the deformation of the polymer 12 under the signal electrodes 10 is decreased when the ponderomotive force 16 onto the polymer surface underneath the signal electrodes 10 weakens. The flattening of the polymer is enhanced further since now a ponderomotive force acts onto the polymer surface also underneath the enhancement electrodes 50, pulling the polymer 12 into the airgap 13 at locations where during the pixel on state a "polymer valley" has been located. Already in this phase 1 the polymer layer 12 flattens out remarkably due to the new balance of ponderomotive forces under the signal 10 and enhancement 50 electrodes. In FIG. 4, the deformation amplitude is smaller than in FIG. 1, ponderomotive forces 16 act also at locations underneath the enhancement electrodes 50 and the reduced forces underneath the signal electrodes 10 has been depicted by shorter arrows.

Depending on the properties of the polymer material 12, it is possible that the surface of polymer layer 12 is flattened out after the aforementioned phase I of the switching off process already to a degree that the pixel can be considered as being practically switched off. However, if this is not the case or if the switching off process is too slow, optional phases 2 and 3 of the switching off process can be applied, as schematically described in following FIGS 6-8.

In phase 2 of the switching off process, the charges are kept in the enhancement electrode capacitor C50 by closing the enhancement electrode transistor TFT50, but the signal electrode capacitor C10 is discharged by driving the column line P to the ground potential and opening the signal electrode transistor TFT10. As depicted in FIG. 6 with arrows, the ponderomotive forces 16 underneath the signal electrodes 10 disappear but the corresponding forces underneath the enhancement electrodes 50 stay substantially unchanged. The balance of forces is thus shifted from the emphasis underneath the signal electrodes 10 (pixel on state) through the balanced force distribution of the switching off phase 1 to a mere emphasis of the forces underneath the enhancement electrodes 50 in the switching off phase 2 Since now in the phase 2 the ponderomotive forces 16 under the signal electrodes 10 are missing and therefore do not hinder the polymer 12 movement anymore, the phase 2 significantly accelerates the flattening out of the polymer layer 12.

Figure 8:
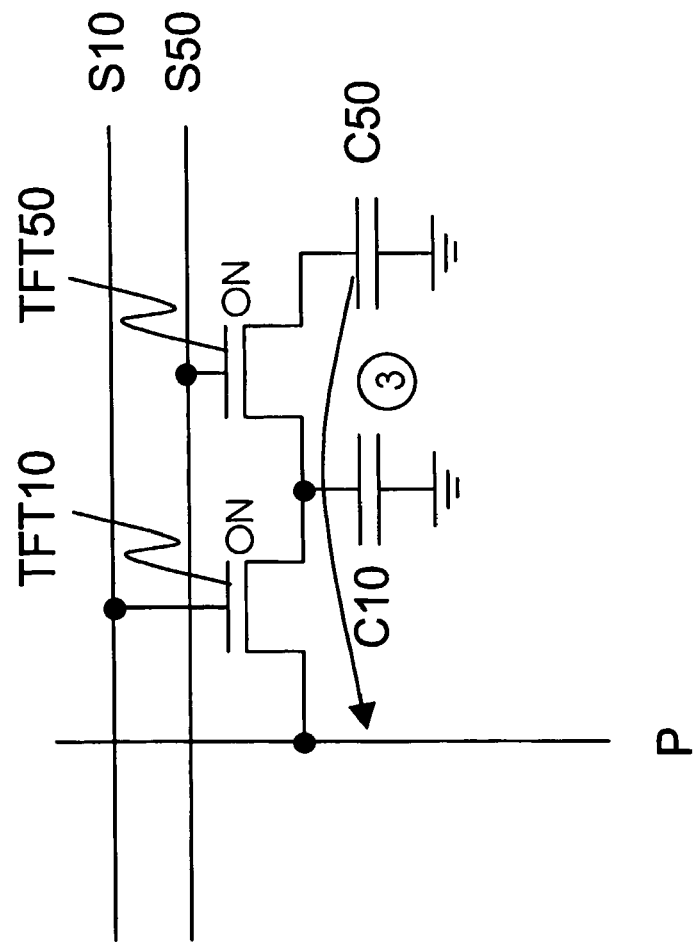
FIG. 8 illustrates schematically the final phase 3 of the switching off sequence in terms of the capacitance of the signal and enhancement electrodes.

The final phase 3 of the switching off process is depicted schematically in FIG. 8. This last phase is started when the polymer 12 has flattened out, so that the pixel can be considered to be completely switched off. This phase has to initiated temporally correctly before the force effect generated by the enhancement electrodes 50 begins to generate an unwanted, "reversed" deformation causing the polymer 12 surface to rise underneath the enhancement electrodes 50. In this phase 3, opening of the enhancement electrode transistor TFT50 discharges the enhancement electrode capacitor C50 through the signal electrode transistor TFT10 to the column line P, which is kept at the ground potential. Since both capacitors C10,C50 are now discharged, no voltages can be seen over the signal- and enhancement electrodes 10,50, implying that no ponderomotive forces 16 act anymore onto the polymer 12 surface. The polymer surface is flattened, standing for the pixel being switched off.

In certain applications, the aforementioned phase 3, i.e. discharging the enhancement electrode 50 to ground might be omitted if the pixel is switched on again in the following phase 1. Doing so saves electrical power, since the signal capacitor C10 has to be filled up from half of the signal voltage to the full signal voltage instead of from zero to the full signal voltage.

In the above given examples the electrode switching elements have been specified to be thin film transistors. The invention is, however, not limited to the use of such switching elements. Other switching element or transistor types might be better suited, for example, for the use in high voltage display backplanes or other optical modulators.

Discharging of the electrode capacitors C10,C50 does not necessarily have to happen by driving the column P to ground potential. Any additional charge recycling schemes obvious for a person skilled in the art, external to the display backplane, can be applied as well.

The new electrode driving scheme presented here provides several significant benefits when implementing enhancement electrode improved displays or other light modulator devices. It reduces cost of the light modulator devices because it does not require the use of an additional power supply and additional column lines to drive the enhancement electrodes. This saves costs for the power supply itself and makes the circuit path design of the component itself much simpler. The simpler component design increases reliability (connections to external components are prone to faults) and therefore increases yield.

The new scheme also reduces the power consumption of the light modulator components. Some power is needed to run the enhancement electrode system for controlling the enhancement electrode switching transistors TFT50. Without the invention, power is dissipated in the additional enhancement electrode power supply due to the limited conversion efficiency of said power supply. Even more critical is the power dissipation in the capacitive enhancement electrodes 50 themselves. The amount of capacitive power dissipated in the enhancement electrodes 50 is substantially equal to the power dissipated in the signal electrodes 10, which in practise means that the power consumption of the prior art type driving scheme is nearly doubled when adapting the enhancement electrodes in use. The power consumption may be somewhat lower than that, if the enhancement electrodes 50 are operated with reduced voltages, which directly reduces also the power consumption. However, because the new scheme does not require any additional power supply, and because it recycles the charges from the signal electrodes 10 further to the enhancement electrodes 50, it minimizes the power consumption very effectively.

The use of the invention is not limited to optical displays. Other light modulator systems based on diffraction, such as optical cross switches, waveguide switches and others can use the active enhancement electrodes and the advanced driving system as well.

The enhancement electrode configuration may be the in-plane-type configuration described in the given examples, but the enhancement electrodes may also have any other type configuration including the sandwich-type configuration explained in detail in PCT/FI02/00512. Further, the enhancement electrodes may be arranged in any manner obvious for a person skilled in the art.

As already mentioned, in its broadest sense, the current invention is not even limited to the use of enhancement electrodes, but other electrical implementations, where the charge storage and transfer is arranged to take place individually for single pixels are possible within the appended claims. For example, instead of enhancement electrodes, a pixel in a light modulator device might be arranged with a charge recycling capacitor, i.e. a charge storage capacitor, which is individually addressable via one or more switching elements.

While the invention has been shown and described above with respect to selected embodiments, it should be understood that these embodiments are only examples and that a person skilled in the art could construct other embodiments utilizing technical details other than those specifically disclosed herein while still remaining within the spirit and scope of the present invention. It should therefore be understood that various omissions and substitutions and changes in the form and detail of the light modulator illustrated, as well as in the operation of the same, may be made by those skilled in the art without departing from the spirit of the invention. It is the intention, therefore, to restrict the invention only in the manner indicated by the scope of the claims appended hereto.

For example, the embodiments of the invention can be extended to light modulator devices where the air gap 13 is replaced with a gap formed from some other suitable gas or vacuum or other deformable polymer. Suitable dielectric and viscoelastic materials 12 include, for example, silicone gel, oil, various polymer materials or other viscous substances that have a tendency to deform when placed in a presence of an electric field, and said materials relax towards their original form or shape after the aforementioned effect ceases.

The transparent electrode structures required in light modulator devices may be made of indium tin oxide (ITO), as is known in the art, or other methods for creating substantially transparent electrode structures on any substantially transparent substrate material can also be employed without departing from the scope of the present invention. If the device is designed to be used in reflection, or the electrode structures are designed to be small enough to cause only minor light blockage, it is also possible to use non-transparent electrode systems for the various electrodes.

Within a single light modulator cell or corresponding primary optical unit the support electrode structure, the signal electrode structure and also the enhancement electrode structure may be each composed of one or more separate electrode zones.

Optimization parameters that may be selected according to the specific application, for a given signal electrode structure, include for example the number and width of the enhancement electrodes, the distance between the enhancement electrodes and the signal electrodes. The enhancement electrode voltage also is a parameter for optimization depending on voltage applied to the signal electrodes and support electrodes.

It is obvious for a person skilled in the art that the operation of the optical devices according to the invention on some applications rely on optical interference, and thus require a certain degree of coherence and/or collimation of the optical signal/beam that is being processed.

The electrically controlled light modulator and the various applications utilizing the same may be used for many types of optical switching purposes. The devices according to the invention can be used, for example, in display panels, electrically controlled lens elements or electrically reconfigurable optical couplers. The last mentioned devices might be used to switch or divide optical signal between several alternative targets, said targets being for example optical waveguides.

What is claimed is:

1. An electrically controlled light modulator device comprising at least one cell, each cell having
    two deformable dielectric layers which meet at an interface, at least one of said layers consisting of a viscoelastic relief forming material,
    a support electrode structure arranged on one side of the dielectric layers,
    a signal electrode structure opposing the support electrode structure such that said layers are located between the support electrode structure and the signal electrode structure,
    an enhancement electrode structure composed of one or more separate electrode zones arranged in the proximity of the signal electrode structure,
    a signal supplier for applying a signal voltage between said support and signal electrode structures to generate an electric field passing at least partly through the two deformable dielectric layers in order to create a surface relief on the viscoelastic material layer, and
    an enhancement signal supplier for applying an enhancement signal voltage between the enhancement electrode structure and the signal electrode structure for enhancing the deformation of the viscoelastic material layer,
    wherein the signal electrode and the enhancement electrode structure are capable of storing electrical charges, the enhancement signal supplier being arranged to transfer electric charge between the signal electrode structure and the enhancement electrode structure in a temporally controlled charge transfer process, and
    wherein the enhancement signal voltage is generated using substantially only the electrical charge transferred from the signal electrode structure to the enhancement electrode structure.

2. The device according to the claim 1, wherein the enhancement signal supplier is arranged to discharge at least part of the electric charge stored in the enhancement electrode structure back to the signal electrode structure and/or to the device ground in a temporally controlled manner.

3. The device according to the claim 1, wherein the temporally controlled charge transfer process comprises a first temporal phase, in which at least part of the electric charge stored in the signal electrode structure is transferred to the enhancement electrode structure.

4. The device according to the claim 3, wherein the temporally controlled charge transfer process further comprises a second temporal phase, in which at least part of the electric charge stored in the signal electrode structure is discharged without affecting the electrical charge stored in the enhancement electrode structure.

5. The device according to the claim 4, wherein the temporally controlled charge transfer process further comprises a third temporal phase, in which at least part of the electric charge stored in both the signal electrode structure and the enhancement electrode structure is discharged substantially simultaneously.

6. The device according to the claim 1, wherein the enhancement electrode structure and the signal electrode structure are arranged substantially in a single common plane with respect to each other and facing opposite the support electrode structure.

7. The device according to the claim 1, wherein the enhancement electrode structure and the signal electrode structure are arranged in substantially different planes with respect to each other and with respect to the opposite support electrode structure.

8. The device according to the claim 1, wherein multiple cells are arranged into a matrix to form an optical display device.

9. A temporally controlled charge transfer process for use in a light modulating device, comprising:
    transferring, in a first temporal phase, at least part of an electrical charge stored in a signal electrode structure to an enhancement electrode structure, and
    generating an enhancement signal voltage between the enhancement electrode structure and the signal electrode structure using substantially only the electrical charge transferred from the signal electrode structure to the enhancement electrode structure,
wherein the light modulating device comprises at least one cell, said cell having:
    two deformable dielectric layers which meet at an interface, at least one of the layers consisting of a viscoelastic relief forming material,
    a support electrode structure arranged on one side of the dielectric layers,
    the signal electrode structure opposing the support electrode structure such that the layers are located between the support electrode structure and the signal electrode structure,
    the enhancement electrode structure composed of one or more separate electrode zones arranged in the proximity of the signal electrode structure, wherein the signal electrode structure and the enhancement electrode structure are capable of storing electrical charges,
    a signal supplier, configured to apply a signal voltage between the support electrode structure and the signal electrode structure, the signal voltage generating an electric field passing at least partly through the two deformable dielectric layers to create a surface relief on the viscoelastic material layer, and
    an enhancement signal supplier, configured to apply the enhancement signal voltage between the enhancement electrode structure and the signal electrode structure for enhancing the deformation of the viscoelastic material layer.

10. The method of claim 9, further comprising:
    discharging, in a second temporal phase, at least part of the electric charge stored in the signal electrode structure without affecting the electric charge stored in the enhancement electrode structure.

11. The method of claim 10, further comprising:
    discharging substantially simultaneously, in a third temporal phase, at least part of the electric charge stored in both the signal electrode structure and the enhancement electrode structure.

12. A light modulating device having at least one cell, each cell having:
    two deformable dielectric layers which meet at an interface, at least one of the layers consisting of a viscoelastic relief forming material,
    a support electrode structure arranged on one side of the dielectric layers,
    a signal electrode structure opposing the support electrode structure such that the layers are located between the support electrode structure and the signal electrode structure,
    an enhancement electrode structure composed of one or more separate electrode zones arranged in the proximity of the signal electrode structure, wherein the signal electrode structure and the enhancement electrode structure are capable of storing electrical charges,
    a signal supplier, configured to apply a signal voltage between the support electrode structure and the signal electrode structure, the signal voltage generating an electric field passing at least partly through the two deformable dielectric layers to create a surface relief on the viscoelastic material layer, and
    an enhancement signal supplier, configured to apply an enhancement signal voltage between the enhancement electrode structure and the signal electrode structure for enhancing the deformation of the viscoelastic material layer,
wherein the light modulating device comprises:
    means for transferring, in a first temporal phase, at least part of a electrical charge stored in the signal electrode structure to the enhancement electrode structure, and
    means for generating an enhancement signal voltage between the enhancement electrode structure and the signal electrode structure using substantially only the electrical charge transferred from the signal electrode structure to the enhancement electrode structure.

13. The light modulating device of claim 12, further comprising:
    means for discharging, in a second temporal phase, at least part of the electric charge stored in the signal electrode structure without affecting the electric charge stored in the enhancement electrode structure.

14. The light modulating device of claim 13, further comprising:
    means for discharging substantially simultaneously, in a third temporal phase, at least part of the electric charge stored in both the signal electrode structure and the enhancement electrode structure.

* * * * *